(12) United States Patent
Sugiura

(10) Patent No.: US 8,125,222 B2
(45) Date of Patent: Feb. 28, 2012

(54) MAGNETIC RESONANCE IMAGING APPARATUS AND SCANNING-CONDITION CREATING METHOD

(75) Inventor: Satoshi Sugiura, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 253 days.

(21) Appl. No.: 12/521,806

(22) PCT Filed: Mar. 3, 2009

(86) PCT No.: PCT/JP2009/053982
§ 371 (c)(1),
(2), (4) Date: Jun. 30, 2009

(87) PCT Pub. No.: WO2009/110478
PCT Pub. Date: Sep. 11, 2009

(65) Prior Publication Data
US 2010/0321016 A1 Dec. 23, 2010

(30) Foreign Application Priority Data
Mar. 3, 2008 (JP) .................................. 2008-052291

(51) Int. Cl.
*G01V 3/00* (2006.01)
(52) U.S. Cl. ........................................................ 324/307
(58) Field of Classification Search .......... 324/300–322; 600/410–435
See application file for complete search history.

(56) References Cited

U.S. PATENT DOCUMENTS

| 6,144,201 | A | 11/2000 | Miyazaki |
| 6,335,979 | B1 | 1/2002 | Seto et al. |
| 7,385,397 | B2 * | 6/2008 | Uchizono et al. ............. 324/318 |
| 7,557,575 | B2 * | 7/2009 | Ookawa et al. ................ 324/309 |
| 7,560,924 | B2 * | 7/2009 | Kanda ............................ 324/307 |
| 7,613,496 | B2 * | 11/2009 | Miyazaki et al. ............. 600/419 |
| 7,689,015 | B2 * | 3/2010 | Takai ............................. 382/128 |

FOREIGN PATENT DOCUMENTS

JP    2003-070766    11/2003

(Continued)

OTHER PUBLICATIONS

JP International Search Report for PCT/JP2009/053982, mailed Jun. 9, 2009.

(Continued)

*Primary Examiner* — Dixomara Vargas
(74) *Attorney, Agent, or Firm* — Nixon & Vanderhye PC

(57) ABSTRACT

A storage unit stores a parameter list that defines a method of creating scanning conditions for a preparation scan from scanning conditions set for a main scan, with respect to each type of scanning. A scanning-condition edit/scan positioning unit receives an operation of selecting a type of a preparation scan, and when the operation of selecting the type of the preparation scan is received, the scanning-parameter limit calculating unit acquires the parameter list corresponding to the type of the preparation scan, from among the parameter lists stored by the storage unit, creates scanning conditions for the preparation scan from scanning conditions set for a main scan based on the parameter list corresponding to the type of the preparation scan. The pulse-sequence execution-data creating unit then causes execution of the preparation scan based on the created scanning conditions.

21 Claims, 12 Drawing Sheets

FOREIGN PATENT DOCUMENTS

JP          2004-24637          1/2004

OTHER PUBLICATIONS

JP Written Opinion of the International Searching Authority for PCT/JP2009/053982, mailed Jun. 9, 2009.

Sakuma et al., "Diagnosis on an ischemic heart disease by contrast-enhanced MRI", Innervision, vol. 15, No. 13, (2000), pp. 59-66.

Deshpande, V.S. et al., "Artifact Reduction in true-FISP Imaging of the Coronary Arteries by Adjusting Imaging Frequency", Magnetic Resonance of Medicine, vol. 49, (2003), pp. 803-809.

* cited by examiner

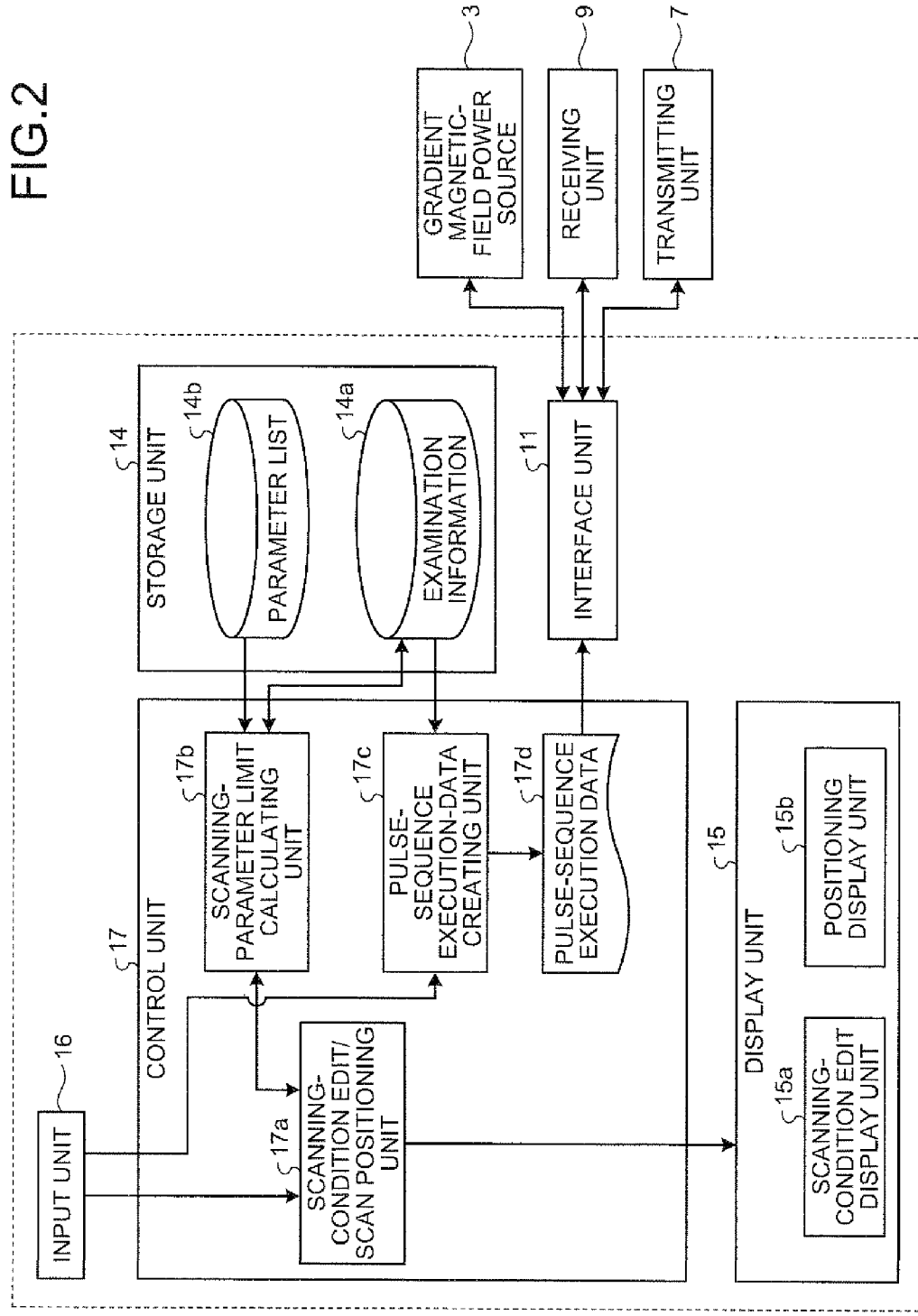

| DELAYED CONTRAST ENHANCEMENT (TI) | PREPARATION SCAN FOR DETERMINING INVERSION TIME(TI) OF DELAYED CONTRAST-ENHANCED IMAGING | | |
|---|---|---|---|
| | 1. VARIABLE PARAMETER | 2. REPLICATED PARAMETER | 3. FIXED PARAMETER |
| SCAN SEQUENCE TYPE | | ○ | |
| DIMENSION | | | ○    2 |
| TR | | ○ | |
| TE | | ○ | |
| TI | ○ | | |
| ETS | - | - | - |
| NUMBER OF ECHOES | - | - | - |
| NAQ | | | ○    1 |
| FLIP ANGLE | | ○ | |
| NUMBER OF PHASE ENCODINGS | | | ○    80 |
| READOUT POINT | | | ○    128 |
| FOV | | ○ | |
| SLICE THICKNESS | | | ○    10 |
| NUMBER OF SLICES | | | ○    1 |
| SCAN CROSS SECTION, PHASE ENCODING DIRECTION | | ○ | |
| NUMBER OF ENCODINGS PER SEGMENT | | ○ | |
| SEGMENT TYPE | | ○ | |
| NUMBER OF DUMMY PULSES | | ○ | |
| NUMBER OF SHOTS | - | - | - |
| FLOW COMPENSATION | | ○ | |
| RF SPOILING | | ○ | |
| PARALLEL IMAGING DIRECTION, SPEED RATE | | | ○    PE,2 |
| NUMBER OF IR PULSES | | ○ | |
| IR FA | | ○ | |
| IR PULSE TYPE | | ○ | |
| NUMBER OF PRESAT PULSES, POSITION, FLIP ANGLE | | ○ | |
| NUMBER OF FAT SUPPRESSION PULSES | | ○ | |
| FAT SUPPRESSION FA | | ○ | |
| FAT SUPPRESSION PULSE TYPE | | ○ | |
| FAT SUPPRESSION PULSE FREQUENCY | | ○ | |
| NUMBER OF MTC PULSES, FA, FREQUENCY | | ○ | |
| GATED INPUT (ECG, PPG, BREATH) | | ○ | |
| GATING MODE | | ○ | |
| %R-R | | ○ | |
| DELAY TIME | | ○ | |
| NUMBER OF DYNAMICS, DELAY TIME | - | - | - |
| NUMBER OF BB PULSES, BBBTI | - | - | - |
| DEPHASING STRENGTH | - | - | - |
| CENTER FREQUENCY | - | - | - |
| VARIABLE-PARAMETER INITIAL VALUE | 220 | | |
| VARIABLE-PARAMETER INCREMENT | 30 | | |
| NUMBER OF REPETITIONS OF VARIABLE-PARAMETER | 4 | | |

FIG.3

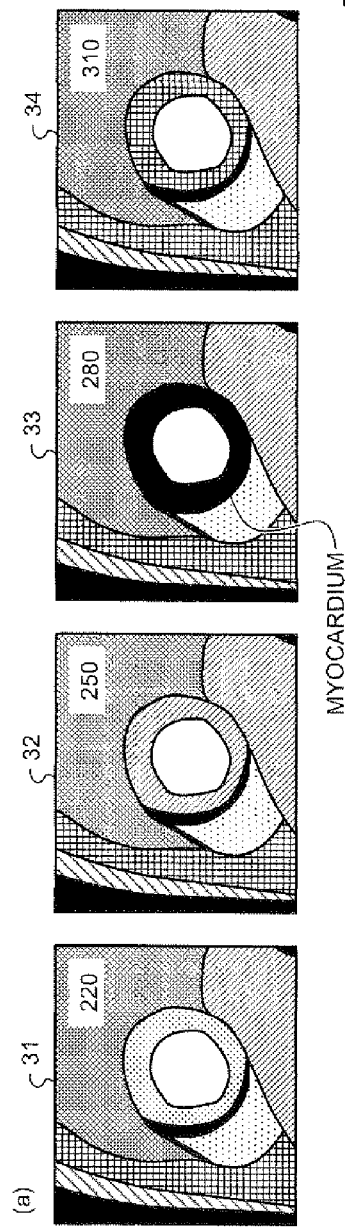

| ECG-Prep | PREPARATION SCAN FOR DETERMINING DELAY TIME(Td) FROM R WAVE IN FBI SCAN | | |
|---|---|---|---|
| | 1. VARIABLE PARAMETER | 2. REPLICATED PARAMETER | 3. FIXED PARAMETER |
| SCAN SEQUENCE TYPE | | ○ | |
| DIMENSION | | | ○ 2 |
| TR [ms] | | ○ | |
| TE [ms] | | ○ | |
| TI [ms] | | ○ | |
| ETS [ms] | | ○ | |
| NUMBER OF ECHOES | | ○ | |
| NAQ | | | ○ 1 |
| FLIP ANGLE, FLOP ANGLE [DEGREE] | | ○ | |
| NUMBER OF PHASE ENCODINGS | | | ○ 128 |
| READOUT POINT | | ○ | |
| FOV [mm] | | ○ | |
| SLICE THICKNESS [mm] | | | ○ 40 |
| NUMBER OF SLICES | | | ○ 1 |
| SCAN CROSS SECTION, PHASE ENCODING DIRECTION | | ○ | |
| NUMBER OF ENCODINGS PER SEGMENT | - | - | - |
| SEGMENT TYPE | - | - | - |
| NUMBER OF DUMMY PULSES | - | - | - |
| NUMBER OF SHOTS | | ○ | |
| FLOW COMPENSATION (0/1/2) | | ○ | |
| RF SPOILING (On/Off) | - | - | - |
| PARALLEL IMAGING DIRECTION, SPEED RATE | | | ○ PE,2 |
| NUMBER OF IR PULSES | | ○ | |
| IR FA [DEGREE] | | ○ | |
| IR PULSE TYPE | | ○ | |
| NUMBER OF PRESAT PULSES, POSITION, FLIP ANGLE | | ○ | |
| NUMBER OF FAT SUPPRESSION PULSES | | ○ | |
| FAT SUPPRESSION FA [DEGREE] | | ○ | |
| FAT SUPPRESSION PULSE TYPE | | ○ | |
| FAT SUPPRESSION PULSE FREQUENCY [Hz] | | ○ | |
| NUMBER OF MTC PULSES, FA, FREQUENCY | | ○ | |
| GATED INPUT (ECG, PPG, BREATH) | | ○ | |
| GATING MODE | | ○ | |
| %R-R | | ○ | |
| DELAY TIME [ms] | ○ | | |
| NUMBER OF DYNAMICS, DELAY TIME | - | - | - |
| NUMBER OF BB PULSES, BBBTI | | ○ | |
| DEPHASING STRENGTH | | ○ | |
| CENTER FREQUENCY [Hz] | - | - | - |
| VARIABLE-PARAMETER INITIAL VALUE | 0 | | |
| VARIABLE-PARAMETER INCREMENT | 100 | | |
| NUMBER OF REPETITIONS OF VARIABLE-PARAMETER | 9 | | |

FIG.8

| Flow-Prep | PREPARATION SCAN FOR DETERMINING GRADIENT MAGNETIC FIELD STRENGTH OF DEPHASING IN FBI SCAN | | | |
|---|---|---|---|---|
| | 1. VARIABLE PARAMETER | 2. REPLICATED PARAMETER | 3. FIXED PARAMETER | |
| SCAN SEQUENCE TYPE | | ○ | | |
| DIMENSION | | | ○ | 2 |
| TR [ms] | | ○ | | |
| TE [ms] | | ○ | | |
| TI [ms] | | ○ | | |
| ETS [ms] | | ○ | | |
| NUMBER OF ECHOES | | ○ | | |
| NAQ | | | ○ | 1 |
| FLIP ANGLE, FLOP ANGLE [DEGREE] | | ○ | | |
| NUMBER OF PHASE ENCODINGS | | | ○ | 128 |
| READOUT POINT | | ○ | | |
| FOV [mm] | | ○ | | |
| SLICE THICKNESS [mm] | | | ○ | 40 |
| NUMBER OF SLICES | | | ○ | 1 |
| SCAN CROSS SECTION, PHASE ENCODING DIRECTION | | ○ | | |
| NUMBER OF ENCODINGS PER SEGMENT | - | - | - | |
| SEGMENT TYPE | - | - | - | |
| NUMBER OF DUMMY PULSES | - | - | - | |
| NUMBER OF SHOTS | | ○ | | |
| FLOW COMPENSATION (0/1/2) | | ○ | | |
| RF SPOILING (On/Off) | - | - | - | |
| PARALLEL IMAGING DIRECTION, SPEED RATE | | | ○ | PE,2 |
| NUMBER OF IR PULSES | | ○ | | |
| IR FA [DEGREE] | | ○ | | |
| IR PULSE TYPE | | ○ | | |
| NUMBER OF PRESAT PULSES, POSITION, FLIP ANGLE | | ○ | | |
| NUMBER OF FAT SUPPRESSION PULSES | | ○ | | |
| FAT SUPPRESSION FA [DEGREE] | | ○ | | |
| FAT SUPPRESSION PULSE TYPE | | ○ | | |
| FAT SUPPRESSION PULSE FREQUENCY [Hz] | | ○ | | |
| NUMBER OF MTC PULSES, FA, FREQUENCY | | ○ | | |
| GATED INPUT (ECG, PPG, BREATH) | | ○ | | |
| GATING MODE | | ○ | | |
| %R-R | | ○ | | |
| DELAY TIME [ms] | | ○ | | |
| NUMBER OF DYNAMICS, DELAY TIME | - | - | - | |
| NUMBER OF BB PULSES, BBBTI | | ○ | | |
| DEPHASING STRENGTH | ○ | | | |
| CENTER FREQUENCY [Hz] | - | - | - | |
| VARIABLE-PARAMETER INITIAL VALUE | -5 | | | |
| VARIABLE-PARAMETER INCREMENT | 5 | | | |
| NUMBER OF REPETITIONS OF VARIABLE-PARAMETER | 7 | | | |

FIG.9

| CENTER FREQUENCY (f0) | PREPARATION SCAN FOR DETERMINING FREQUENCY OF FAT SUPPRESSION PULSE IN MRCA SCAN | | | |
|---|---|---|---|---|
| | 1. VARIABLE PARAMETER | 2. REPLICATED PARAMETER | 3. FIXED PARAMETER | |
| SCAN SEQUENCE TYPE | | ○ | | |
| DIMENSION | | | ○ | 2 |
| TR [ms] | | | ○ | 3.6 |
| TE [ms] | | | ○ | 1.8 |
| TI [ms] | - | - | - | |
| ETS [ms] | - | - | - | |
| NUMBER OF ECHOES | - | - | - | |
| NAQ | | | ○ | 1 |
| FLIP ANGLE, FLOP ANGLE [DEGREE] | | | ○ | 70 |
| NUMBER OF PHASE ENCODINGS | | | ○ | 96 |
| READOUT POINT | | | ○ | 256 |
| FOV [mm] | | | ○ | 175x300 |
| SLICE THICKNESS [mm] | | | ○ | 10 |
| NUMBER OF SLICES | | | ○ | 1 |
| SCAN CROSS SECTION, PHASE ENCODING DIRECTION | | ○ | | |
| NUMBER OF ENCODINGS PER SEGMENT | - | | ○ | 3 |
| SEGMENT TYPE | - | | ○ | interleave |
| NUMBER OF DUMMY PULSES | | | ○ | 5 |
| NUMBER OF SHOTS | - | - | - | |
| FLOW COMPENSATION (0/1/2) | | | ○ | none |
| RF SPOILING (On/Off) | - | - | - | |
| PARALLEL IMAGING DIRECTION, SPEED RATE | | | ○ | 1 |
| NUMBER OF IR PULSES | | | ○ | 0 |
| IR FA [DEGREE] | | | ○ | - |
| IR PULSE TYPE | | | ○ | |
| NUMBER OF PRESAT PULSES, POSITION, FLIP ANGLE | | | ○ | 0 |
| NUMBER OF FAT SUPPRESSION PULSES | | | ○ | 0 |
| FAT SUPPRESSION FA [DEGREE] | | | ○ | - |
| FAT SUPPRESSION PULSE TYPE | | | ○ | - |
| FAT SUPPRESSION PULSE FREQUENCY [Hz] | | | ○ | - |
| NUMBER OF MTC PULSES, FA, FREQUENCY | | | ○ | 0 |
| GATED INPUT (ECG, PPG, BREATH) | | | ○ | none |
| GATING MODE | | | ○ | - |
| %R-R | | | ○ | - |
| DELAY TIME [ms] | | | ○ | - |
| NUMBER OF DYNAMICS, DELAY TIME | - | - | - | |
| NUMBER OF BB PULSES, BBBTI | - | - | - | |
| DEPHASING STRENGTH | - | - | - | |
| CENTER FREQUENCY [Hz] | ○ | | | |
| VARIABLE-PARAMETER INITIAL VALUE | -200 | | | |
| VARIABLE-PARAMETER INCREMENT | 40 | | | |
| NUMBER OF REPETITIONS OF VARIABLE-PARAMETER | 6 | | | |

FIG.10

| DELAYED CONTRAST ENHANCEMENT(TI) | PREPARATION SCAN FOR DETERMINING INVERSION TIME(TI) OF DELAYED CONTRAST-ENHANCED IMAGING | | |
|---|---|---|---|
| | 1. VARIABLE PARAMETER | 2. REPLICATED PARAMETER | 3. FIXED PARAMETER |
| SCAN SEQUENCE TYPE | | O | |
| DIMENSION | | | O | 2 |
| TR | | O | |
| TE | | O | |
| TI | O | | |
| ETS | - | - | - |
| NUMBER OF ECHOES | - | - | - |
| NAQ | | | O | 1 |
| FLIP ANGLE | | O | |
| NUMBER OF PHASE ENCODINGS | | | O | 80 |
| READOUT POINT | | | O | 128 |
| FOV | | O | |
| SLICE THICKNESS | | | O | 10 |
| NUMBER OF SLICES | | | O | 1 |
| SCAN CROSS SECTION, PHASE ENCODING DIRECTION | | O | |
| NUMBER OF ENCODINGS PER SEGMENT | | O | |
| SEGMENT TYPE | | O | |
| NUMBER OF DUMMY PULSES | | O | |
| NUMBER OF SHOTS | - | - | - |
| FLOW COMPENSATION | | O | |
| RF SPOILING | | O | |
| PARALLEL IMAGING DIRECTION, SPEED RATE | | | O | PE,2 |
| NUMBER OF IR PULSES | | O | |
| IR FA | | O | |
| IR PULSE TYPE | | O | |
| NUMBER OF PRESAT PULSES, POSITION, FLIP ANGLE | | O | |
| NUMBER OF FAT SUPPRESSION PULSES | | O | |
| FAT SUPPRESSION FA | | O | |
| FAT SUPPRESSION PULSE TYPE | | O | |
| FAT SUPPRESSION PULSE FREQUENCY | | O | |
| NUMBER OF MTC PULSES, FA, FREQUENCY | | O | |
| GATED INPUT (ECG, PPG, BREATH) | | O | |
| GATING MODE | | O | |
| %R-R | | O | |
| DELAY TIME | | O | |
| NUMBER OF DYNAMICS, DELAY TIME | - | - | - |
| NUMBER OF BB PULSES, BBBTI | - | - | - |
| DEPHASING STRENGTH | - | - | - |
| CENTER FREQUENCY | - | - | - |
| VARIABLE-PARAMETER INITIAL VALUE | 220 | O | |
| VARIABLE-PARAMETER INCREMENT | 30 | | |
| NUMBER OF REPETITIONS OF VARIABLE-PARAMETER | 4 | | |

FIG.11

MAGNETIC RESONANCE IMAGING APPARATUS AND SCANNING-CONDITION CREATING METHOD

This application is the U.S. national phase of International Application No. PCT/JP2009/053982 filed 3 Mar. 2009, which designated the U.S. and claims priority to JP Application No. 2008-052291 filed 3 Mar. 2008, the entire contents of each of which are hereby incorporated by reference.

TECHNICAL FIELD

The present invention relates to a magnetic resonance imaging apparatus and a scanning-condition creating method, and particularly relates to a magnetic resonance imaging apparatus and a scanning-condition creating method that can provide a highly detailed image through a preparation scan for optimizing setting conditions of the apparatus and scanning parameters of a pulse sequence to be used for scanning.

BACKGROUND ART

Conventionally, a magnetic resonance imaging method used by a magnetic resonance imaging apparatus (hereinafter, referred to as "MRI (Magnetic Resonance imaging) apparatus") is a method of acquiring chemical and physical microscopic information about a substance by using a phenomenon that when being placed in a magnetic field, an aggregation of subject nuclear spins resonates with a radio-frequency magnetic field in which each atomic nucleus spins at a particular frequency (resonance frequency) responding to its own unique magnetic moment and an existing magnetic field, and generates a signal (magnetic resonance signal) in a relaxation process.

According to the magnetic resonance imaging method, the contrast, the spatial resolution, the image S/N ratio, the scan time, and the like, of an image depend on scanning parameters of scanning, for example, a Repetition Time (TR), an Echo Time (TE), an Inversion Time (TI), a Flip Angle (FA) of a radio-frequency magnetic field pulse for excitation, a delay time from an R wave obtained from an electrocardiogram to data collection, and a center frequency f0 of the radio-frequency magnetic field of the apparatus. For this reason, the MRI apparatus is an apparatus that needs to set specially various scanning conditions among medical devices.

Among the scanning parameters described above, there are some parameters each of which needs to be set to an optimal value depending on a condition of a subject or a condition of the apparatus depending on a scanning method. Regarding such parameters, a search for an optimal value of the parameter is conducted to maintain an image quality by performing a test scan immediately before a main scan under a state in which a subject is placed in the apparatus. Hereinafter, a scan for obtaining an image to be used for an actual diagnosis is referred to as a "main scan", and a test scan to be executed prior to the main scan for optimizing specific scanning parameters for the main scan is referred to as a "preparation scan".

For example, regarding a delayed myocardial contrast enhancement method, Non-patent Document 1 describes that "because a T1 relaxation time of a myocardium varies depending on a dose of a contrast agent and a time after an injection, an examination of IR-MRI is performed after selecting an inversion time (TI) at which the signal strength of a normal myocardium becomes substantially zero by performing a test scan". Moreover, Patent Document 1 discloses a method of performing a preparation scan for optimizing an electrocardiogram-gated timing and/or the strength of a gradient magnetic-field pulse related to a flow void phenomenon in non-contrast enhanced angiography. Furthermore, Non-patent Document 2 describes a method of setting a frequency with which image artifacts in the region of interest becomes the least amount by visually confirming as a scan is performed for a short time while changing the center frequency f0 of the apparatus, prior to coronary artery imaging according to a Steady State Free Precession (SSFP) method.

Patent Document 1: JP-A 2003-70766 (KOKAI).
Non-patent Document 1: Hajime Sakuma et al., "Diagnosis on an ischemic heart disease by contrast-enhanced MRI", INNERVISION, 2000, Vol. 15, No. 13, pp. 59-66.
Non-patent Document 2: Deshpande V S et al., "Artifact Reduction in True-FISP Imaging of the Coronary Arteries by Adjusting Imaging Frequency", Magnetic Resonance in Medicine, 2003, Vol. 49, No. 5, pp. 803-809.

DISCLOSURE OF INVENTION

Problem to be Solved by the Invention

Considering respective scanning parameters for a preparation scan and a main scan, the scanning parameters of the MRI apparatus described above can be categorized into three kinds as follows:

(1) Scanning parameter that a search for the optimal value of the parameter is conducted, and the found value is to be used for a main scan;
(2) Scanning parameter that has an influence on evaluation of a variable parameter of the above (1); and
(3) Scanning parameter that a value different from that of a preparation scan is to be used for a main scan in accordance with a purpose of the main scan.

The scanning parameter of (2) is to be set to the same value for the main scan and the preparation scan, so that the value used in the preparation scan needs to be replicated and used in the main scan. The scanning parameter of (3) can be set to different values between the main scan and the preparation scan, and the values of some of them need to be changed in accordance with a purpose of the main scan, and the values of some other of them can be changed depending on a situation. However, because during a preparation scan, a plurality of scans are repeatedly performed while changing the values of the parameters, it is desirable to finish the preparation scan within a short scan time in total, therefore, a parameter among the parameters of (3) that does not have influence on determination of the values of the parameters of (1) (for example, spatial resolution) is often set to a lower value as the value for the preparation scan than that for the main scan in many cases.

The operator needs to understand such categories of scanning parameters, and then to edit respective scanning conditions of a preparation scan and a main scan independently and by maintaining the relation between them. However, to achieve this, sufficient knowledge and experience are required. Moreover, to obtain a high diagnostic resolution constantly in a clinical situation, appropriate scanning conditions need to be constantly set, consequently, such complicated operations are substantial obstacles to attempts to reduce an examination time, to save work, and to improvement quality and reproducibility.

The present invention has been made to solve the problem according to the conventional technology as described above, and an object of the present invention is to provide a magnetic resonance imaging apparatus that can achieve improvement in operationality by automating operations relevant to setting of scanning conditions for a preparation scan.

Means for Solving Problem

According to one aspect of the present invention, a magnetic resonance imaging apparatus includes a storage unit that stores definition information about condition creation that defines a method of creating scanning conditions for a preparation scan from scanning conditions set for a main scan, with respect to each type of scanning; a definition-information acquiring unit that acquires definition information about condition creation corresponding to a type of a main scan from among definition information about condition creation stored by the storage unit; a preparation-scan condition creating unit that creates scanning conditions for a preparation scan from scanning conditions set for a main scan based on the definition information about condition creation acquired by the definition-information acquiring unit; a preparation-scan control unit that causes execution of a preparation scan based on scanning conditions for the preparation scan created by the preparation-scan condition creating unit; a main-scan condition setting unit that sets values of at least part of scanning parameters among a plurality of scanning parameters included in scanning conditions set for a main scan based on a scan result obtained, by executing the preparation scan by the preparation-scan control unit; and a main-scan control unit that causes execution of a main scan based on scanning conditions for the main scan that includes the scanning parameters set by the main-scan condition setting unit.

According to another aspect of the present invention, a magnetic resonance imaging apparatus includes a storage unit that stores information that categorizes a plurality of scanning parameters included in scanning conditions, into a first scanning parameter of which value is to be changed during a preparation scan, a second scanning parameter that a same value is used for a main scan and a preparation scan, and a third scanning parameter of which values different between a main scan and a preparation scan can be used;

an input unit that receives input of values of a plurality of scanning parameters related to scanning conditions for a main scan; and a control unit that causes execution of a preparation scan and a main scan based on the values of the scanning parameters related to the scanning conditions for the main scan input via the input unit, and information that categorizes a plurality of scanning parameters stored by the storage unit.

According to another aspect of the present invention, a scanning-condition creating method of creating scanning conditions of a magnetic resonance imaging apparatus, the method, includes storing into a storage unit definition information about condition creation that defines a method of creating scanning conditions for a preparation scan from scanning conditions set for a main scan, with respect to each type of scanning; acquiring definition information about condition creation corresponding to a type of a main scan from among definition information about condition creation stored by the storage unit; creating scanning conditions for a preparation scan from scanning conditions set for the main scan based on acquired definition information about condition creation; causing execution of a preparation scan based on created scanning conditions for the preparation scan; and setting values of at least part of scanning parameters among a plurality of scanning parameters included in scanning conditions set for a main scan based on a scan result obtained by executing the preparation scan.

Effect of the Invention

According to the present invention, improvement in operationality can be achieved by automating operations relevant to setting of scanning conditions for a preparation scan.

BRIEF DESCRIPTION OF DRAWINGS

FIG. 2 is a functional block diagram of a detailed configuration of a computer system.
FIG. 3 is a schematic diagram of a parameter list for delayed myocardial contrast enhancement.
FIG. 7 is a schematic diagram for explaining a process that a variable parameter is set into scanning conditions for a main scan.
FIG. 8 is a schematic diagram of an example of a parameter list for ECG-Prep.
FIG. 9 is a schematic diagram of an example of a parameter list for Flow-Prep.
FIG. 10 is a schematic diagram of an example of a parameter list for center-frequency setting.
FIG. 11 is a schematic diagram of an example of a parameter list when setting a scanning position.

EXPLANATIONS OF LETTERS OR NUMERALS

Figure 1:
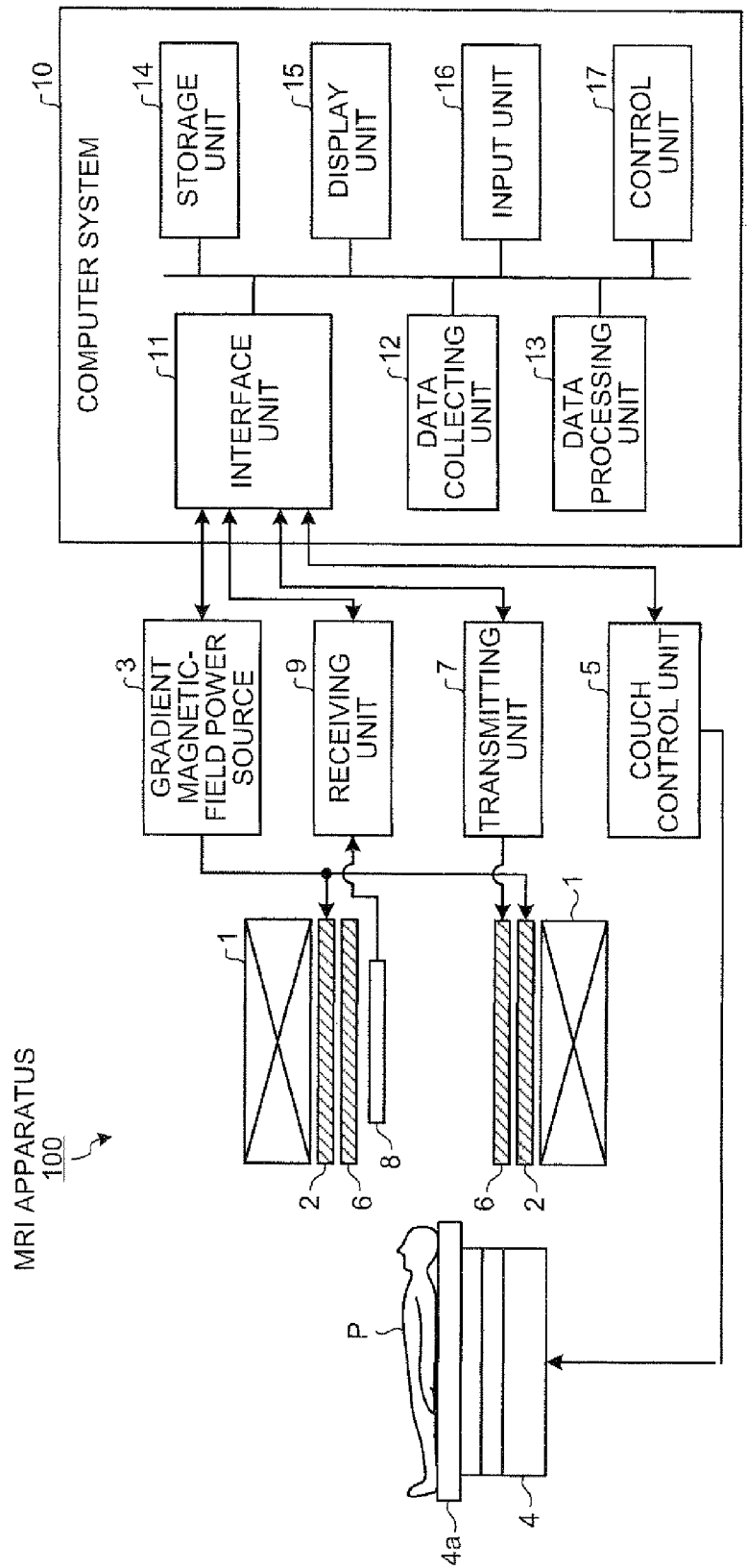
FIG. 1 is a schematic diagram of a configuration of an MRI apparatus according to an embodiment.

100 MRI apparatus
1 static magnetic-field magnet
2 gradient magnetic-field coil
3 gradient magnetic-field power source
4 patient couch
4a top plate
5 couch control unit
6 RF transmitting coil
7 transmitting unit
8 RE receiving coil
9 receiving unit
10 computer system
11 interface unit
12 data collecting unit
13 data processing unit
14 storage unit
14b parameter list
14a examination information
15 display unit
15a scanning-condition edit display unit
15b positioning display unit
16 input unit
17 control unit
17a scanning-condition edit/scan positioning unit
17b scanning-parameter limit calculating unit
17c pulse-sequence execution-data creating unit
17d pulse-sequence execution data

BEST MODE(S) FOR CARRYING OUT THE INVENTION

Exemplary embodiments of a magnetic resonance imaging apparatus and a scanning-condition creating method according to the present invention will be explained below in detail with reference to the accompanying drawings. Scanning according to a delayed contrast-enhanced myocardial imaging method (hereinafter, referred to as "delayed myocardial contrast enhancement") is explained in the following embodiment as an example of a scanning method according to which the value of a particular scanning parameter is determined by performing a preparation scan before a main scan.

The delayed myocardial contrast enhancement is a scanning method of rendering a cardiac infarction area in high signals by injecting to a subject a contrast agent that has an effect of reduction in a T1 relaxation time, and then taking a T1 weighted image of a heart after 15 to 20 minutes from the injection, as described in Non-patent document 1. To obtain a high contrast between a normal myocardium and an infarct focus through such delayed myocardial contrast enhancement, it is required to set an inversion recovery time (TI) as a scanning condition to a value such that a signal value of the normal myocardium is to be as close to zero as possible. Such optimal lengths of TI vary depending on a dose of the contrast agent and a time after the injection, therefore, a preparation scan in which lengths of TI are varied are performed prior to a main scan.

Embodiment

First of all, a configuration of an MRI apparatus according to an embodiment of the present invention is explained below with reference to FIG. 1. FIG. 1 is a schematic diagram of a configuration of the MRI apparatus according to the embodiment. As shown in the figure, an MRI apparatus 100 includes a static magnetic-field magnet 1, a gradient magnetic-field coil 2, a gradient magnetic-field power source 3, a patient couch 4, a couch control unit 5, an RE transmitting coil 6, a transmitting unit 7, an RE receiving coil 8, a receiving unit 9, and a computer system 10.

The static magnetic-field magnet 1 is formed in a hollow cylindrical shape, and generates a uniform static magnetic field in a space its inside. For example, a permanent magnet, or a super conducting magnet is used as the static magnetic-field magnet 1.

The gradient magnetic-field coil 2 is formed in a hollow cylindrical shape, and is arranged inside the static magnetic-field magnet 1. The gradient magnetic-field coil 2 is formed of three coils in combination corresponding to x, y, and z axes orthogonal to one another. The three coils generate gradient magnetic fields along three directions of the x, y, and z axes, respectively, by individually receiving a current supply from the gradient magnetic-field power source 3, which will be described later. It is assumed that the z axis direction is the same direction as that of the static magnetic field.

The gradient magnetic fields of the x, y, and z axes generated by the gradient magnetic-field coil 2 correspond to, for example, a slice-selective gradient magnetic field. Gs, a phase encoding gradient magnetic field Ge, and a readout gradient magnetic field Gr, respectively. The slice-selective gradient magnetic field Gs is used for arbitrarily setting a scan cross section. The phase encoding gradient magnetic field Ge is used for changing a phase of a magnetic resonance signal in accordance with a spatial position. The readout gradient magnetic field Gr is used for changing the frequency of a magnetic resonance signal in accordance with a spatial position.

The gradient magnetic-field power source 3 supplies a current to the gradient magnetic-field coil 2 based on pulse-sequence execution data sent from the computer system 10.

The patient couch 4 is a device that includes a top plate 4a on which a subject P is to be placed, and under the control of the couch control unit 5, which will be described later, the patient couch 4 inserts the top plate 4a on which the subject P is placed, into a hole (a scanning space) of the gradient magnetic-field coil 2. Usually, the patient couch 4 is placed such that the longitudinal direction of the patient couch 4 is to be parallel to the central axis of the static magnetic-field magnet 1.

The couch control unit 5 is a device that controls the patient couch 4, and moves the top plate 4a in the longitudinal direction and upward and downward by driving the patient couch 4.

The RF transmitting coil 6 is a coil arranged inside the gradient magnetic-field coil 2, and generates a radio-frequency magnetic field by receiving supply of a radio-frequency pulse from the transmitting unit 7.

The transmitting unit 7 transmits a radio-frequency pulse corresponding to a Larmor frequency to the RF transmitting coil 6 based on pulse-sequence execution data sent from the computer system 10, and includes an oscillating unit, a phase selecting unit, a frequency converting unit, an amplitude modulating unit, a radio-frequency power amplifying unit, and the like. The oscillating unit generates a radio-frequency signal of a resonance frequency unique to a subject nucleus in the static magnetic field. The phase selecting unit selects a phase of the radio-frequency signal. The frequency converting unit converts a frequency of the radio-frequency signal output by the phase selecting unit. The amplitude modulating unit modulates amplitude of the radio-frequency signal output by the frequency converting unit in accordance with, for example, a sinc function. The radio-frequency power amplifying unit amplifies the radio-frequency signal output by the amplitude modulating unit. As a result of operations performed by the above units, the transmitting unit 7 transmits a radio-frequency pulse corresponding to a Larmor frequency to the RF transmitting coil 6.

The RF receiving coil 8 is a coil arranged inside the gradient magnetic-field coil 2, and receives a magnetic resonance signal irradiated from the subject owing to an influence of the radio-frequency magnetic field described above. Upon receiving a magnetic resonance signal, the RF receiving coil 8 outputs the magnetic resonance signal to the receiving unit 9.

The receiving unit 9 creates magnetic-resonance signal data based on the magnetic resonance signal output by the RF receiving coil 8 based on pulse-sequence execution data sent from the computer system 10. After creating magnetic-resonance signal data, the receiving unit 9 transmits the magnetic-resonance signal data to the computer system 10.

The computer system 10 is a device that performs total control of the MRI apparatus 100, data collection, image reconstruction, and the like, and includes an interface unit 11, a data collecting unit 12, a data processing unit 13, a storage unit 14, a display unit 15, an input unit 16, and a control unit 17.

The interface unit 11 is connected to the gradient magnetic-field power source 3, the couch control unit 5, the transmitting unit 7, and the receiving unit 9; and controls input and output of signals that are given and received between each of the connected units and the computer system 10.

The data collecting unit 12 is a processing unit that collects magnetic-resonance signal data transmitted from the receiving unit 9 via the interface unit 11. When magnetic-resonance signal data is collected, the data collecting unit 12 stores the collected magnetic-resonance signal data into the storage unit 14.

The data processing unit 13 is a processing unit that performs post-processing, i.e., reconstruction processing, such as a Fourier transform, on the magnetic-resonance signal data stored in the storage unit 14, and creates spectrum data or image data of a desired nuclear spin inside the subject P.

The storage unit 14 is a storage unit that stores magnetic-resonance signal data collected by the data collecting unit 12, and image data created by the data processing unit 13, with respect to each subject P.

The display unit 15 is a device that displays various information, such as spectrum data or image data, under the control of the control unit 17. A display device, such as a liquid crystal display, can be used as the display unit 15.

The input unit 16 is a device that receives various instructions and information input from an operator. As the input unit 16, a pointing device, such as a mouse or a trackball, a selecting device, such as a mode switch, and an input device, such as a keyboard, can be used as required.

The control unit 17 is a processing unit that includes a Central Processing Unit (CPU) and a memory, both of which are not shown, and controls the MRI apparatus 100 overall.

As described above, a general configuration of the MRI apparatus according to the embodiment has been explained. Under such configuration, the MRI apparatus 100 according to the embodiment is configured to automate operations relevant to setting of scanning conditions for a preparation scan by the computer system 10, thereby being capable to achieve improvement in operationality.

Specifically, the MRI apparatus 100 according to the embodiment is configured, such that the computer system 10 stores a parameter list for each of scan types that defines a method of creating scanning conditions for a preparation scan from scanning conditions set for a main scan; and when receiving an operation of selecting a type of a preparation scan from an operator, the computer system creates scanning conditions for the preparation scan from the scanning conditions set for the main scan based on a parameter list corresponding to the selected type of the preparation scan, and then performs the preparation scan. Functions that the computer system 10 has are specifically explained below.

At first, a detailed configuration of the computer system 10 is explained below in detail with reference to FIG. 2. FIG. 2 is a functional block diagram of a detailed configuration of the computer system 10. The figure shows configurations particularly relevant to the present invention among configurations of the display unit 15, the control unit 17, and the storage unit 14, and interrelations between the interface unit 11, the storage unit 14, the display unit 15, the input unit 16, and the control unit 17.

As shown in the figure, the storage unit 14 stores examination information 14a and a parameter list 14b as information particularly relevant to the present invention.

The examination information 14a is information that indicates scanning conditions appropriate to each type among various scans, and includes set values of various scanning parameters included in the scanning conditions, such as the type of scanning, the position of a slice (cross section), a slice thickness, the number of slices, and the like.

The parameter list 14b is information that defines a method of creating scanning conditions for a preparation scan from scanning conditions set for a main scan. Specifically, the parameter list 14b is information in which a plurality of scanning parameters included in scanning conditions for a preparation scan are categorized into three kinds, namely, a first scanning parameter that is to be set by searching for an optimal value through a preparation scan, a second scanning parameter that is to be set to the same value for the main scan and the preparation scan, and a third scanning parameter that can be set to different values between the main scan and the preparation scan, and then a method of setting the value is defined parameter by parameter of the scanning parameters.

According to the embodiment, each of the third scanning parameters is assumed to be set to a predetermined fixed value for a preparation scan. For this reason, according to the embodiment, the parameter list 14b further defines the third scanning parameters as a predetermined fixed value parameter by parameter of the scanning parameters, as a value to be set for a preparation scan. Hereinafter, the first parameter included in the parameter list 14b is referred to as "a variable parameter, the second parameter is referred to as "a replicated parameter", and the third parameter is referred to as "a fixed parameter".

The parameter lists 14b are preliminarily stored in the storage unit 14 type by type of scans, and scanning parameters that are to be categorized in each of the parameter lists 14b include parameters relevant to composition of a pulse sequence, such as TR and TE, a flip angle, and a delay time, and parameters about setting conditions of the apparatus, such as a center frequency and a transmission gain.

A method of setting a value defined by the parameter list 14b is specifically explained below with respect to each category of the scanning parameters. The parameter list 14b for delayed myocardial contrast enhancement is explained below as an example. FIG. 3 is a schematic diagram of the parameter list 14b for delayed myocardial contrast enhancement. As shown in the figure, the parameter list 14b includes information about a plurality of scanning parameters included in the scanning conditions for a preparation scan, such as "scan sequence type", "dimension", "TR", "TE", "TI", and the like.

Each of the scanning parameters included in the parameter list 14b is categorized, as the variable parameter, the replicated parameter, or the fixed parameter. According to delayed myocardial contrast enhancement as described above, a preparation scan needs to be performed by changing lengths of TI. For this reason, as shown in the figure, "TI" is categorized as the variable parameter in the parameter list 14b for delayed myocardial contrast enhancement. Additionally, the "scan sequence type", "TR", "TE", the "flip angle", and the like are each categorized as the replicated parameter, and the "dimension", "NAQ", "the number of phase encodings", the "readout point", and the like are each categorized as the fixed parameter.

Among the parameters in the parameter list 14b, the value of each scanning parameter categorized as the replicated parameter is copied from the scanning parameters of the scanning conditions for the main scan, when performing a preparation scan. For example, according to an example of delayed myocardial contrast enhancement as shown in the figure, values of the "scan sequence type", "TR", "TE", and the "flip angle" are to be copied from the scanning parameters of the scanning conditions for the main scan.

With respect to each scanning parameter categorized as the variable parameter, an "initial value" that indicates a value to be set at first into the variable parameter during the preparation scan, an "increment" that indicates a change amount when changing the value of the parameter during the preparation scan, and "the number of repetitions" that indicates the number of times of performing preparation scanning are further defined by the parameter list 14b. For example, according to the example of delayed myocardial contrast enhancement shown in the figure, the initial value is defined as "220", the increment is defined as "30", and the number of repetitions is defined as "4". Accordingly, when performing a preparation scan of delayed myocardial contrast enhancement, scanning is executed repeatedly four times, the value of "TI" is to be "220" at the first time, "250" at the second time, "280" at the third time, and "310" at the fourth time.

Although it is explained below in a case where information indicating a change amount when changing the value of a variable parameter has been set in the parameter list 14b, similar information can be input by an operator via the input unit 16.

Each scanning parameter categorized as the fixed parameter is defined as a fixed value set for a preparation scan in the parameter list 14b. For example, according to the example of delayed myocardial contrast enhancement as shown in the figure, the "dimension" is defined as "2", "NAQ" is defined as "1", "the number of phase encodings" is defined as "80", and the "read out point" is defined as "128", as a fixed value, respectively. Accordingly, when performing a preparation scan of delayed myocardial contrast enhancement, the "dimension" is set to "2", "NAQ" is set to "1", "the number of phase encodings" is set to "80", and the "read out point" is set to "128", respectively.

Returning to FIG. 2, as shown in the figure, the display unit 15 includes a scanning-condition edit display unit 15a and a positioning display unit 15b as functional units particularly relevant to the present invention.

The scanning-condition edit display unit 15a displays information about scanning conditions for a main scan. Specifically, under the control of a scanning-condition edit/scan positioning unit 17a, which will be described later; the scanning-condition edit display unit 15a displays on the display unit 15 a scanning-condition edit screen, which includes an area, for displaying information about the scanning conditions for the main scan parameter by parameter of the scanning parameters, and a user interface for receiving selection of the type of a preparation scan, a start instruction for the preparation scan, and the like, from the operator.

Figure 4:
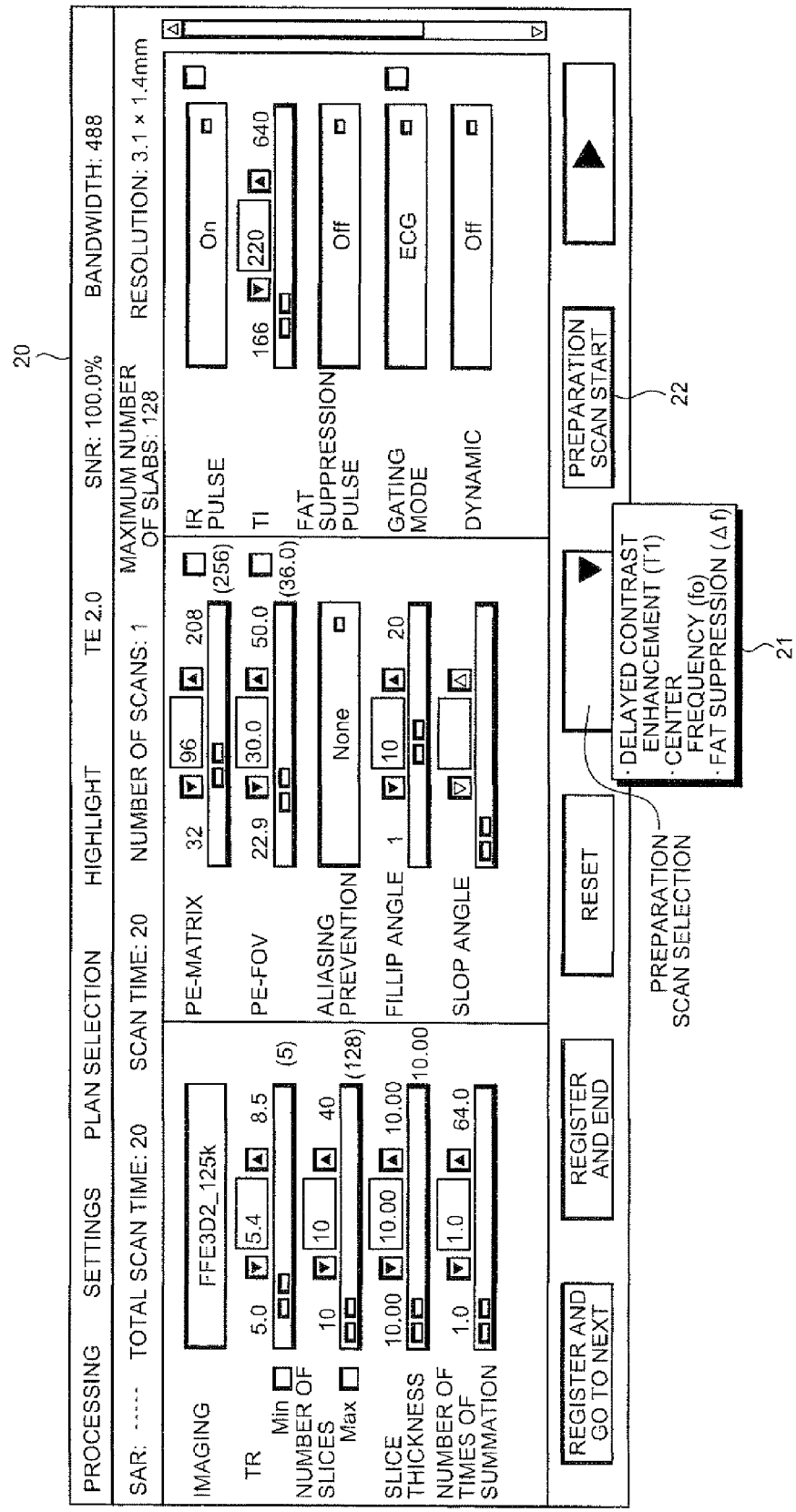
FIG. 4 is a schematic diagram of an example of information displayed by a scanning-condition edit display unit.

FIG. 4 is a schematic diagram of an example of a scanning-condition edit screen 20 displayed by the scanning-condition edit display unit 15a. As shown in the figure, for example, the scanning-condition edit screen 20 displayed by the scanning-condition edit display unit 15a includes an area for displaying set values parameter by parameter of the scanning parameters, such as "TR", "the number of slices", the "slice thickness", "the number of times of summation"; a preparation-scan selection pull-down menu 21 for receiving selection of the type of a preparation scan (for example, delayed contrast enhancement, center frequency, and fat suppression); and a preparation scan start button 22 for receiving the start instruction for a preparation scan.

The operator can set scanning conditions for a main scan by setting the scanning parameters displayed on the scanning-condition edit screen 20 to respective values via the input unit 16. Moreover, the operator can select a type of a preparation scan by operating the preparation-scan selection pull-down menu 21 displayed on the scanning-condition edit screen 20, and can make a start instruction for the preparation scan by pressing the preparation-scan start button.

Returning to FIG. 2, the positioning display unit 15b is a display unit that displays a positioning image to be a reference when determining the position of a slice to be scanned, and displays a figure indicating the slice on the positioning image based on scanning conditions set by the operator. When a scanning condition is changed by the operator, the positioning display unit 15b changes the position and/or the shape of a figure indicating a slice in a synchronized manner with display of the scanning conditions by the scanning-condition edit display unit 15a.

As shown in the figure, the control unit 17 includes, as functional units particularly relevant to the present invention, the scanning-condition edit/scan positioning unit 17a, a scanning-parameter limit calculating unit 17b, and a pulse-sequence execution-data creating unit 17c.

The scanning-condition edit/scan positioning unit 17a is a processing unit that receives information about edit of a scanning condition and positioning of a slice. Specifically, to begin with, when receiving a display request for the scanning-condition edit screen 20 via the input unit 16, the scanning-condition edit/scan positioning unit 17a controls and causes the scanning-condition edit display unit 15a to display the scanning-condition edit screen 20.

When receiving an operation of setting scanning conditions for a main scan via the input unit 16, the scanning-condition edit/scan positioning unit 17a passes values set in the scanning parameters on the scanning-condition edit screen 20 to the scanning-parameter limit calculating unit 17b parameter by parameter of the scanning parameters; and when limit values of scanning parameters are returned from the scanning-parameter limit calculating unit 17b correspondingly, the scanning-condition edit/scan positioning unit 17a controls and causes the scanning-condition edit display unit 15a to display the returned limit values onto the scanning-condition edit screen 20 parameter by parameter of the scanning parameters.

Moreover, when receiving an operation of selecting a type of a preparation scan via the input unit 16, the scanning-condition edit/scan positioning unit 17a passes to the scanning-parameter limit calculating unit 17b respective values of the scanning parameters displayed at the moment on the scanning-condition edit display unit 15a, and instructs the scanning-parameter limit calculating unit 17b to create scanning conditions for a preparation scan of the selected type.

Furthermore, after the preparation scan is performed, the scanning-condition edit/scan positioning unit 17a displays a plurality of images obtained through the preparation scan onto the display unit 15, and further receives an operation of selecting one image from among the displayed images via the input unit 16. When receiving the operation of selecting an image, the scanning-condition edit/scan positioning unit 17a acquires a value of a variable parameter from the scanning conditions included in supplemental information about the selected image, passes the acquired value of the variable parameter to the scanning-parameter limit calculating unit 17b, which will be described later, and makes an instruction to set the scanning conditions for the main scan to the values.

The scanning-parameter limit calculating unit 17b is a processing unit that calculates a limit value of a scanning parameter, and creates scanning conditions for a preparation scan. Specifically, upon receiving the value of a scanning parameter from the scanning-condition edit/scan positioning unit 17a, the scanning-parameter limit calculating unit 17b calculates a limit value of another scanning parameter that depends on the received scanning parameter. The scanning-parameter limit calculating unit 17b then returns the calculated limit value of the scanning parameter to the scanning-condition edit/scan positioning unit 17a, and each time stores the received value of the scanning parameter and the calculated value of the scanning parameter into the storage unit 14 as the examination information 14a that indicates scanning conditions for the main scan.

Moreover, when the scanning-condition edit/scan positioning unit 17a, instructs the scanning-parameter limit calculating unit 17b to create scanning conditions for a preparation scan, the scanning-parameter limit calculating unit 17b acquires the parameter list 14b corresponding to the type of the scanning conditions from the storage unit 14, and creates scanning conditions for the preparation scan from the scanning conditions set for the main scan based on the acquired parameter list 14b. The scanning-parameter limit calculating unit 17b then stores the created scanning conditions for the preparation scan as the examination information 14a into the storage unit 14.

Specifically explaining creation of scanning conditions for a preparation scan, the scanning-parameter limit calculating unit 17b creates scanning conditions for a preparation scan by setting the scanning parameters to respective values based on a setting method defined by the parameter list 14b.

Precisely, the scanning-parameter limit calculating unit 17b sets the fixed parameters parameter by parameter of the scanning parameters to respective fixed values defined by the parameter list 14b. Moreover, the scanning-parameter limit calculating unit 17b copies values of the replicated parameters parameter by parameter of the scanning parameters from the scanning conditions for the main scan stored as the examination information 14a by the storage unit 14. Furthermore, the scanning-parameter limit calculating unit 17b sets the value of the variable parameter such that preparation scanning is to be repeated the number of times set as the "number of repetitions" in the parameter list 14b, while changing a value set as the "initial value" by a change amount set as the "increment".

In this way, when the operator selects a type of a preparation scan, the scanning-parameter limit calculating unit 17b sets values of respective scanning parameters based on the parameter list 14b corresponding to the selected type of a preparation scan, accordingly scanning conditions for a desired preparation scan are automatically created.

Moreover, the scanning-parameter limit calculating unit 17b sets a value of a variable parameter received together with an instruction into the scanning conditions for the main scan stored as the examination information 14a by the storage unit 14, when the scanning-parameter limit calculating unit 17b is instructed by the scanning-condition edit/scan positioning unit 17a to set the value of the variable parameter into the scanning conditions for the main scan.

As the scanning-parameter limit calculating unit 17b sets the value of a variable parameter that is determined based on images obtained through the preparation scan into the scanning conditions for the main scan in the process, conclusive scanning conditions for the main scan to be performed subsequently to the preparation scan are set.

The pulse-sequence execution-data creating unit 17c is a processing unit that causes execution of scanning by using the examination information 14a stored in the storage unit 14. Specifically, when receiving the start instruction for a preparation scan via the input unit 16, the pulse-sequence execution-data creating unit 17c builds a pulse sequence and creates pulse-sequence execution data 17d based on scanning conditions for the preparation scan stored as the examination information 14a in the storage unit 14. The pulse-sequence execution-data creating unit 17c then causes the gradient magnetic-field power source 3, the transmitting unit 7, and the receiving unit 9 to execute the preparation scan by sending the created pulse-sequence execution data 17d via the interface unit 11.

Similarly, when receiving the start instruction for the main scan via the input unit 16, the pulse-sequence execution-data creating unit 17c creates the pulse-sequence execution data 17d based on scanning conditions for the main scan stored as the examination information 14a in the storage unit 14, and then causes the gradient magnetic-field power source 3, the transmitting unit 7, and the receiving unit 9 to execute the main scan by sending the created pulse-sequence execution data 17d.

A process procedure of scanning performed by the MRI apparatus 100 according to the embodiment is explained below. To compare scanning according to the present invention with conventional scanning, the following description explains a process procedure of the conventional scanning, and then explains the process procedure of scanning performed by the MRI apparatus 100 according to the embodiment. Moreover, the following description explains as an example a case where an optimal inversion recovery time TI of delayed myocardial contrast enhancement is obtained by performing a preparation scan, and then a main scan is performed.

Figure 5:
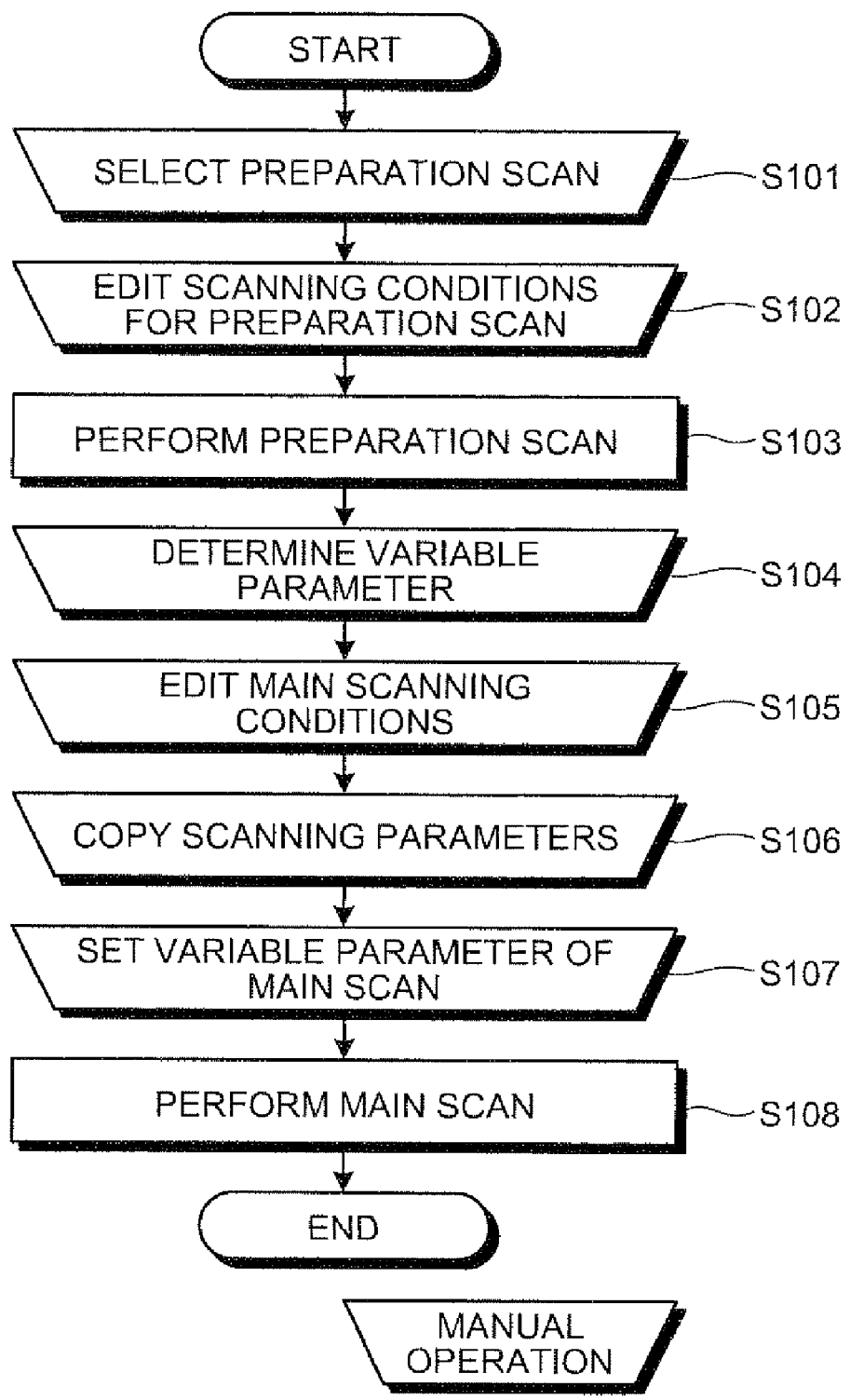
FIG. 5 is a flowchart of a process procedure of conventional scanning.

The process procedure of the conventional scanning is explained below first. FIG. 5 is a flowchart of the process procedure of the conventional scanning. As shown in the figure, according to the conventional scanning, to begin with, the operator selects a preparation scan (Step S101). It is assumed in this example that the operator selects the same pulse sequence as that to be used in the main scan. For example, in a case of delayed myocardial contrast enhancement, an operator selects a segmented gradient field echo method, that uses an inversion pulse in combination.

Subsequently, the operator edits scanning conditions for the preparation scan (Step S102). For example, during a preparation scan for delayed myocardial imaging, scanning is repeatedly performed a plurality of number of times while changing TI, therefore, it is desired to set scanning conditions so as to save a total examination time. For this reason, to reduce a scan time at the sacrifices of the spatial resolution and the S/N ratio within a range in which at least change in the contrast is perceptible, the operator selects two-dimensional scanning even when the main scan is three-dimensional scanning, and sets the number of phase encodings, the number of slices, and the number of times of summation to smaller values than those in the main scan.

When making such sacrifices, to compensate a reduction in the S/N ratio according to the above setting, the operator sets, in many cases, the slice thickness to a thicker one than that of a slice to be used in the main scan. Furthermore, the operator needs to set carefully the repetition time TR, the echo time TE, the flip angle, the number and the flip angle of a fat suppression pulse and a presaturation pulse, and the like, to the same values as those to be used in the main scan such that an influence of TI being changed during the preparation scan onto a T1 contrast through the preparation scan is to be the same as that through the main scan.

Moreover, according to the segmented gradient field echo method, the contrast changes depending on a time from an inversion pulse until collecting data of k-space center. For this reason, the operator needs to make the number of encoding per segment and the echo collection order in a segment (segment type) the same as those in the main scan. As described above, among the scanning parameters, there are some scanning parameters each of which needs to replicate a value unique to the type of a pulse sequence.

In this way, after the operator sets the scanning conditions for the preparation scan, the MRI apparatus performs the preparation scan based on the set scanning conditions (Step S103).

When a plurality of images are then taken through the preparation scan, the operator determines the optimal value of the variable parameter based on the images (Step S104). For example, according to delayed myocardial contrast enhancement, the operator selects an image in which a normal myocardium has the lowest signal from among the images of different TIs, and determines that the TI value of the selected image is the optimal TI value.

Subsequently, the operator edits scanning conditions for the main scan (Step S105). At the step, the operator sets the dimension of scanning (2D or 3D), the spatial resolution, the number of times of summation, the number of slices, and the like.

Moreover, the operator confirms whether each scanning parameter supposed to be set to the same value in the preparation scan and the main scan has the same value as that in the preparation scan; and if different, the value of the parameter is copied from the scanning conditions for the preparation scan (Step S106).

Furthermore, the operator sets the value of the variable parameter determined based, on the images obtained through the preparation scan into the scanning conditions for the main scan (Step S107). For example, according to delayed myocardial contrast enhancement, the operator sets the value of TI determined based on the images obtained through the preparation scan into the scanning conditions for the main scan.

In this way, after the operator sets the scanning conditions for the main scan, the MRI apparatus performs the main scan based on the set scanning conditions (Step S108).

The process procedure of the conventional scanning is explained above, and the processes of Steps S101, S102, S104, S105, S106, and S107 are manually performed by the operator in the above process procedure. Particularly, because setting of the scanning parameters at Steps S105 and S106 depends on a pulse sequence to be used for scanning, its operation needs to be performed without mistakes while carefully considering influence of each parameter on the variable parameter, so that the operation requires substantial time and effort.

Figure 6:
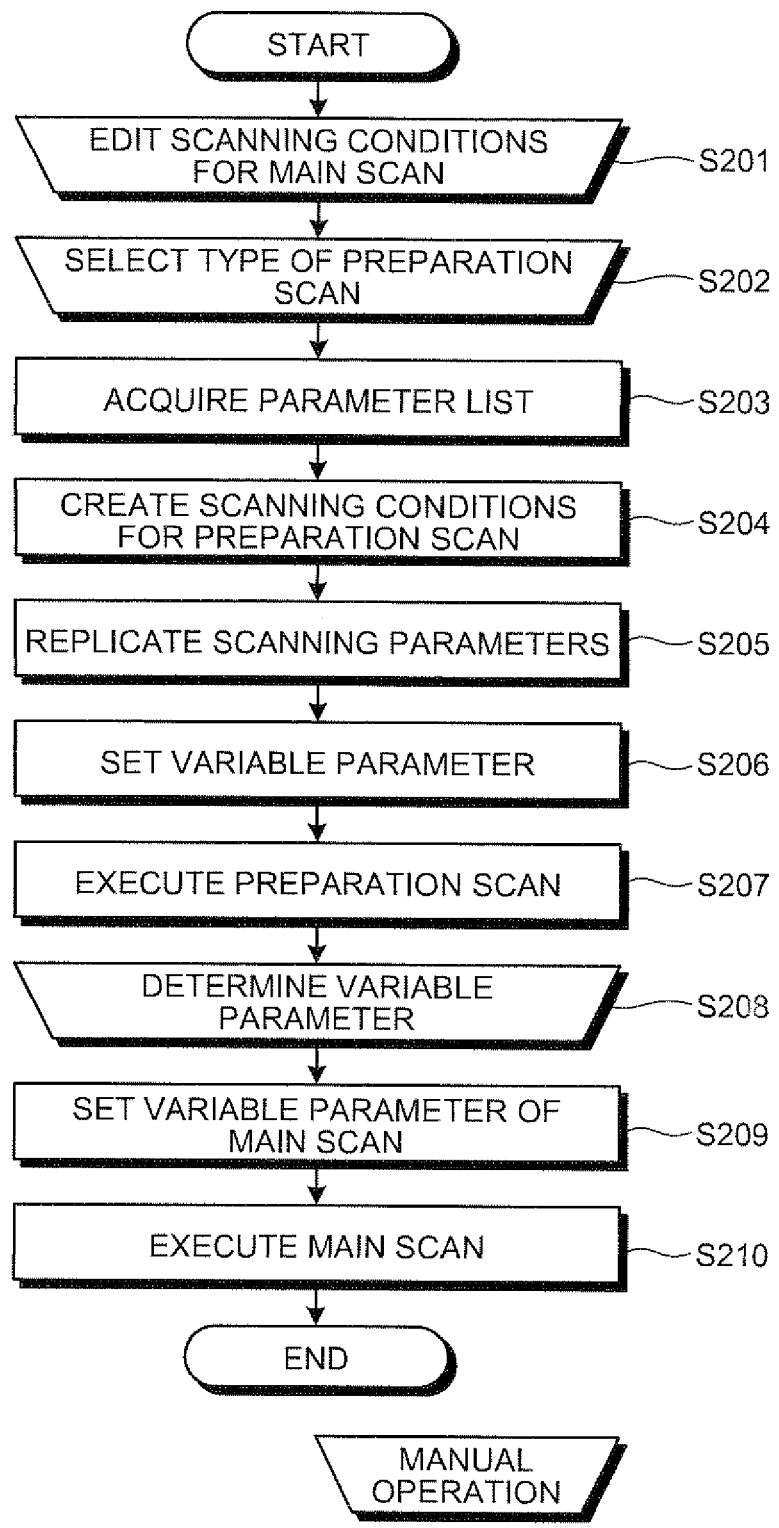
FIG. 6 is a flowchart of a process procedure of scanning performed by the MRI apparatus according to the embodiment.

A process procedure of scanning performed by the MRI apparatus 100 according to the embodiment is explained below. FIG. 6 is a flowchart of the process procedure of scanning performed by the MRI apparatus 100 according to the embodiment. As shown in the figure, according to scanning performed by the MRI apparatus 100 according to the embodiment, to begin with, the operator edits the scanning conditions for the main scan similarly to a usual scan that does not require preparation scan (Step S201).

Subsequently, the operator selects a type of a preparation scan (Step S202). Specifically, the operator selects a preparation scan by operating a user interface displayed on the scanning-condition edit display unit 15a (for example, the preparation-scan selection pull-down menu 21 shown in FIG. 4). The reason why the type of a preparation scan is selectable is because, ever one pulse sequence has a plurality of uses, and for example in this example, the segmented D gradient field echo method can perform delayed contrast-enhanced imaging and coronary artery imaging, each of which is configured to optimize a different parameter through a preparation scan.

When the operator selects a preparation scan in this way, in the MRI apparatus 100, the scanning-condition edit/scan positioning unit 17a receives an operation of selecting the type of the preparation scan via the input unit 16, and then the scanning-parameter limit calculating unit 17b acquires the parameter list 14b corresponding to the selected type of the preparation scan from the storage unit 14 (Step S203).

The scanning-parameter limit calculating unit 17b then creates scanning conditions for the preparation scan by setting values into respective scanning parameters based on a setting method defined by the parameter list 14b (Step S204). Specifically, to begin with, the scanning-parameter limit calculating unit 17b sets the fixed parameters of the scanning conditions for the preparation scan to the fixed values defined by the parameter list 14b parameter by parameter of the scanning parameters.

Moreover, the scanning-parameter limit calculating unit 17b replicates the replicates parameters of the scanning conditions for the preparation scan parameter by parameter of the scanning parameters from the scanning conditions for the main scan stored as the examination information 14a by the storage unit 14 (Step S205).

Furthermore, the scanning-parameter limit calculating unit 17b sets the value of the variable parameter such that preparation scanning is to be repeated the number of times set as the number of repetitions based on the "initial value", the "increment", and "the number of repetitions" in the parameter list 14b (Step S206). In this way, the MRI apparatus 100 according to the embodiment automatically creates scanning conditions for a preparation scan.

After that, when the operator makes a start instruction of the preparation scan, in the MRI apparatus 100, the pulse-sequence execution-data creating unit 17c causes execution of the preparation scan by repeating scanning a certain number of times based on the set scanning conditions for the preparation scan (Step S207).

When a plurality of image taken through the preparation scan is then displayed on the display unit 15, the operator selects from among them an image that is the most suitable for the purpose of scanning (Step S208).

When an image is selected by the operator, in the MRI apparatus 100, the scanning-condition edit/scan positioning unit 17a receives an operation of selecting the image via the input unit 16, and the scanning-parameter limit calculating unit 17b sets the value of the variable parameter corresponding to the selected image into the scanning conditions for the main scan (Step S209).

Processes of setting a variable parameter into scanning conditions for a main scan by the scanning-condition edit/scan positioning unit 17a and the scanning-parameter limit calculating unit 17b are specifically explained below. FIG. 7 is a schematic diagram for explaining a process that a variable parameter is set into scanning conditions for a main scan. The figure shows a case where delayed myocardial contrast enhancement is executed as a preparation scan, which scanning is executed repeatedly four times while changing the value of TI from 220 milliseconds by 30 milliseconds.

In such case, as shown in (a) in the figure, the scanning-condition edit/scan positioning unit 17a displays on the display unit 15 an image 31 of a left ventricle myocardium that is scanned with 220 milliseconds of the TI value, an image 32 of a left ventricle myocardium that is scanned with 250 milliseconds of the TI value, an image 33 of a left ventricle myocardium that is scanned with 280 milliseconds of the TI value, and an image 34 of a left ventricle myocardium that is scanned with 310 milliseconds of the TI value, respectively.

It is assumed that the operator selects an image of the lowest pixel value of the myocardium, i.e., the image 33 in this case. In such case, when receiving an operation of selecting the image 33 via the input unit 16, the scanning-condition edit/scan positioning unit 17a acquires the TI value, 280 milliseconds, from the scanning conditions included in supplemental information about the image 33.

The scanning-parameter limit calculating unit 17b then sets the TI value among the scanning parameters included in the scanning conditions for the main scan stored as the examination information 24a by the storage unit 14 to 280 milliseconds. Accordingly, as shown in (b) in the figure, the scanning-condition edit display unit 15*a* displays "280" in an area 23 for indicating the TI value on the scanning-condition edit screen 20.

In this way, the variable parameter is set by the scanning-condition edit/scan positioning unit 17*a* and the scanning-parameter limit calculating unit 17*b*, and the scanning conditions for the main scan are conclusively set.

Returning to FIG. 6, after that, when the operator makes a start instruction for the main scan, in the MRI apparatus 100, the pulse-sequence execution-data creating unit 17*c* causes the execution of the main scan based on the set scanning conditions for the preparation scan (Step S210).

As described above, according to the MRI apparatus 100 according to the embodiment, during an examination that requires a preparation scan to be performed prior to a main scan, the operator only needs to make a start instruction for the preparation scan after performing only condition edit of the main scan, thereby avoiding mistaking a parameter that needs to be replicated between the preparation scan and the main scan. As a result, operations relevant to scanning becomes simple and easy, and scanning becomes more successful. Moreover, a time required for the whole examination is reduced by automating operations, the operating rate of the apparatus is improved, and a burden on a patient can be reduced. Furthermore, a time required for educating an operator can be omitted.

Although an example of delayed myocardial contrast enhancement is explained above as an example of a scanning method that the value of a particular scanning parameter is determined by performing a preparation scan before a main scan, the MRI apparatus 100 according to the embodiment can automatically create a pulse sequence of the preparation scan also through another scanning method by preliminarily storing the parameter list 14*b* corresponding to the scanning method in to the storage unit 14.

For example, another example of a scanning method, of determining the value of a particular scanning parameter by performing a preparation scan before a main scan is an "FBI (Fresh Blood Imaging) method", which is one of non-contrast-enhanced MRI angiography methods. The FBI method is a method that enables rendering a vessel with reliability without injecting contrast agent by scanning a fresh blood flow pulsated from a heart at a fast and stable flow rate with respect to each predetermined cardiac phase. Specifically, the FBI method is an imaging method of executing three-dimensional scanning that repeats every set of a plurality of heart beats an operation of collecting echo signals equivalent to those of a certain slice encoding in a manner being gated with a signal indicating a cardiac phase of the subject collected by electrocardiograph or electroencephalograph, to obtain a water (blood)-weighted image that a T2 component of blood is weighted.

According to such FBI method, to obtain an image good at rendering a vessel, it needs to set scanning conditions under which an echo signal (magnetic resonance signal) emitted from the subject becomes the strongest. It is known that the strength of an echo signal depends on a delay time (Td) from an R wave. For this reason, according to the FBI method, an optimal delay time (a delay time according to which the strengths of echo signals of both of the artery and the vein are strong (referred to as a first delay time), a delay time according to which the strength of an echo signal of the vein is strong, while the an echo signal of the artery is small (referred to as a second delay time), or the both of the first delay time and the second delay time) is determined, by performing a preparation scan. The preparation scan that is performed by changing the delay time (Td) to determine the optimal delay time is called as "ECG-Prep".

Moreover, as another method developed from the FBI method, there is a method of scanning a blood vessel of a low flow rate of the blood flow at a high image quality, such as a blood vessel in a lower limb, by matching the application direction of a read-out gradient magnetic-field pulse to the direction of a blood blow, and then adding a dephasing pulse for controlling the degree of suppressing a blood-flow signal to before and after the read-out gradient magnetic-field pulse. According to the method, the optimal strength of a dephasing pulse for controlling the degree of suppressing a blood-flow signal is determined through a preparation scan. The preparation scan that is performed by changing the strength of a control pulse to determine the optimal strength of the control pulse is called as "Flow-Prep".

According to the scanning by the FBI method described above, a main scan is usually performed by using a three-dimensional fast spin echo method; however, because a way of rendering a target blood vessel depends on an order or a timing of collection of data filling a k-space, there are some scanning parameters that are desired to use the same values in the preparation scan and the main scan, among the scanning parameters set as scanning condition. Such scanning parameters are not necessarily the same as those according to the segmented gradient echo method to be used in delayed myocardial contrast enhancement.

Based on the above description, the parameter list 14*b* for ECG-Prep and the parameter list 14*b* for Flow-Prep used for scanning by the FBI method are explained below. FIG. 8 is a schematic diagram of an example of the parameter list 14*b* for ECG-Prep, and FIG. 9 is a schematic diagram of an example of the parameter list 14*b* for Flow-Prep.

According to ECG-Prep, because a preparation scan is performed by changing a delay time, the "delay time" is categorized as the variable parameter in the parameter list 14*b* for ECG-Prep, as shown in FIG. 8. Differing from the case of delayed myocardial contrast enhancement, "TI", "ETS", and "the number of echoes" are categorized as the replicated parameter.

On the other hand, according to Flow-Prep, because a preparation scan is performed by changing the strength of a dephasing pulse, the "Dephasing strength" is categorized as the variable parameter in the parameter list 14*b* for Flow-Prep, as shown in FIG. 9. Differing from the case of delayed myocardial contrast enhancement, "TI", "ETS", and "the number of echoes" are categorized as the replicated parameter.

Although explained above is a non-contrast-enhanced MRI angiography method according to the FBI method is explained above, in addition to this, for example, there is a case where a preparation scan is performed for determining an optimal center frequency (f0) in coronary angiography. FIG. 10 is a schematic diagram of an example of the parameter list 14*b* for center-frequency setting. In such case, to perform a preparation scan by changing the center frequency, the "center frequency" is categorized as the variable parameter in the parameter list 14*b* for the center-frequency setting, as shown in the figure.

In this way, the MRI apparatus 100 according to the embodiment automatically creates a pulse sequence of a preparation scan by preliminarily storing the parameter list 14*b* corresponding to the scanning method in to the storage unit 14. Accordingly, the MRI apparatus 100 according to the embodiment can finish the whole examination by each of various scanning methods by performing the substantially same operations as those in a usual scan that does not require preparation scan.

As described above, according to the embodiment, the storage unit 14 stores the parameter list 14b for each of scan types that defines a method of creating scanning conditions for a preparation scan from scanning conditions set for a main scan. Moreover, the scanning-condition edit/scan positioning unit 17a receives an operation of selecting the type of a preparation scan; when the operation of selecting the type of a preparation scan is received, the scanning-parameter limit calculating unit 17b acquires the parameter list 14b corresponding to the type of the preparation scan from among the parameter lists 14b stored by the storage unit 14, and creates scanning conditions for the preparation scan from the scanning conditions set for the main scan, based on the acquired parameter list 14b. The pulse-sequence execution-data creating unit 17c then causes the execution of the preparation scan based on the created scanning conditions. Consequently, according to the embodiment, improvement in operationality can be achieved by automating operations relevant to setting of scanning conditions for a preparation scan.

Moreover, according to the embodiment, the parameter list 14b is information in which a plurality of scanning parameters included in scanning conditions for a preparation scan are categorized into three kinds, namely, the variable parameter that is to be set by searching for an optimal value through a preparation scan, the replicated parameter that is to be set to the same value for the main scan and the preparation scan, and the fixed parameter that can be set to different values between the main scan and the preparation scan, and then a method of setting the value is defined parameter by parameter of the scanning parameters; and the scanning-parameter limit calculating unit 17b creates scanning conditions for a preparation scan by setting the value of each scanning parameter based on the setting method defined by the parameter list 14b; accordingly, when performing scanning that requires to set various kinds and a number of scanning parameters as scanning conditions, operations relevant to setting of scanning conditions for a preparation scan can be automated.

Furthermore, according to the embodiment, because the scanning parameters categorized by the parameter list 14b include parameters relevant to building of a pulse sequence, when performing a preparation scan for determining the optimal value of each of the scanning parameters related to the pulse sequence, such as TR and TE, a flip angle, and a delay time, operations relevant to setting of scanning conditions for a preparation scan can be automated.

Moreover, according to the embodiment, because the scanning parameters categorized by the parameter list 14b include parameters relevant to setting conditions of the apparatus, when performing a preparation scan for determining the optimal value of each of the scanning parameters related to the setting conditions of the apparatus, such as a center frequency and a transmit gain, operations relevant to setting of scanning conditions for a preparation scan can be automated.

Furthermore, according to the embodiment, the parameter list 14b is information that further defines the fixed parameters as a predetermined fixed value parameter by parameter of the scanning parameters, as a value to be set for a preparation scan, and the scanning-parameter limit calculating unit 17b sets the fixed parameters parameter by parameter of the scanning parameters to respective fixed values defined by the parameter list 14b; accordingly, when performing a preparation scan that needs to set a fixed value into a scanning parameter that can be set to different values between the main scan and the preparation scan, operations relevant to setting of scanning conditions for a preparation scan can be automated.

Moreover, according to the embodiment, the scanning-condition edit/scan positioning unit 17a displays a plurality of images obtained through a preparation scan onto the display unit 15, and receives an operation of selecting one of the displayed images; when the scanning-condition edit/scan positioning unit 17a receives the operation of selecting an image, the scanning-parameter limit calculating unit 17b sets a variable parameter included in scanning conditions set for a main scan to the value of the variable parameter used when the image is taken; accordingly, the value of the variable parameter for the main scan are automatically set only by selecting a desired image from among images taken through the preparation scan by an operator. Accordingly, operations relevant to setting of the variable parameter, which has been conventionally performed by manually inputting a value can be performed by an easy operation.

The embodiment is configured such that the scanning-condition edit/scan positioning unit 17a receives an operation of selecting a type of a preparation scan, and when the operation of selecting the type of the preparation scan is received, the scanning-parameter limit calculating unit 17b creates scanning conditions for the preparation scan based on the parameter list 14b corresponding to the type of the preparation scan.

However, the present invention is not limited to this; it can be configured such that, for example, scanning conditions are preliminarily categorized with respect to each examination area and each scanning (examination) type, and when receiving scanning conditions for a main scan from an operator, the scanning-condition edit/scan positioning unit 17a allows the operator to select an examination area and a scanning type first, and then to edit the scanning conditions. In this way, by allowing the operator preliminarily to select the type of the main scan, the type of a required preparation scan is automatically determined from the type of the main scan, so that a process in, which the scanning-condition edit/scan positioning unit 17a receives an operation of selecting the type of a preparation scan can be omitted.

In such case, the scanning-parameter limit calculating unit 17b acquires the parameter list 14b corresponding to the type of the main scan instead of the type of the preparation scan received by the scanning-condition edit/scan positioning unit 17a from among the parameter lists 14b stored by the storage unit 14, and then creates scanning conditions for the preparation scan from the scanning conditions for the main scan based on the acquired parameter list 14b.

Accordingly, the preparation scan is to be automatically performed only by making a start instruction for scanning after setting the scanning conditions for the main scan, consequently, operations relevant to setting of scanning conditions for the preparation scan can be easier operations. For example, when performing scanning according to the FBI method as a main scan, as a delay time (Td) from an R wave and the strength of a dephasing pulse are set respectively as variable parameters that need to be determined through a preparation scan, a series of scans, namely, ECG-Prep, Flow-Prep, and the main scan, can be successively executed automatically.

Furthermore, although the embodiment is explained above in the case where scanning conditions for a preparation scan are created from scanning conditions for a main scan, the present invention is not limited to this. For example, it can be configured such that a scanning position for the preparation scan can be set from the scanning position set for the main scan.

In such case, specifically, the parameter list 14b defines a method of setting a scanning position for the preparation scan from a scanning position set for the main scan. FIG. 11 is a schematic diagram of an example of the parameter list 14b when setting a scanning position. As shown in the figure, for example, the parameter list 14b includes information about scanning parameters similar to those shown in FIG. 3, and further includes information indicating a "scanning position". The information indicating a scanning position is categorized as the replicated parameter in the parameter list 14b.

Figure 12:
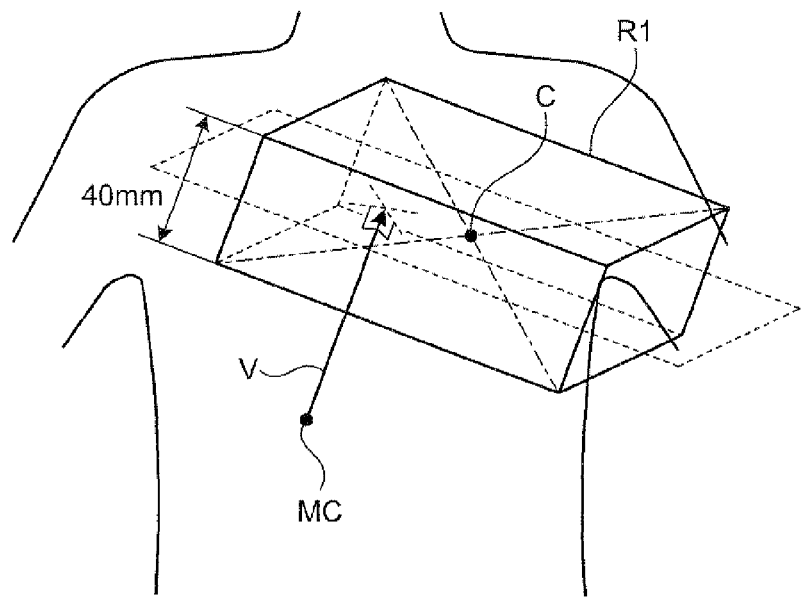
FIG. 12 is a schematic diagram (1) for explaining setting of a scanning position by a scanning-parameter limit calculating unit.
Figure 13:
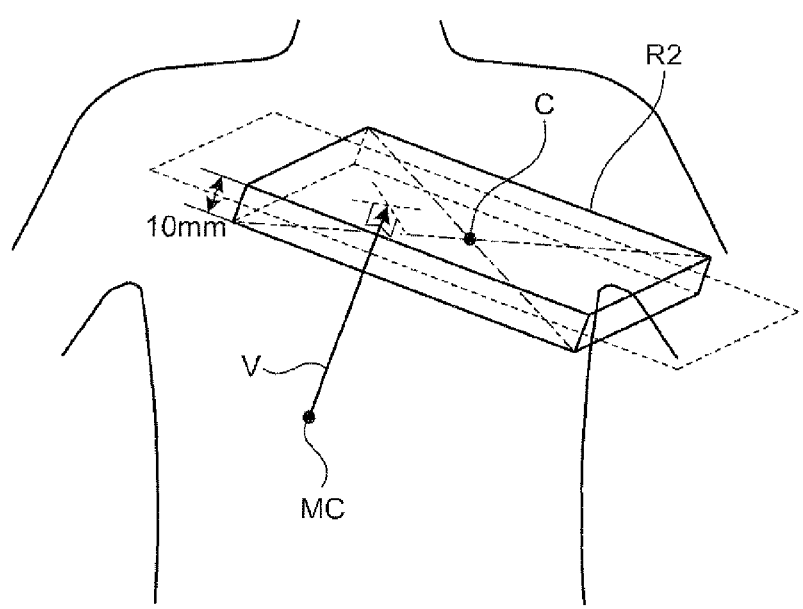
FIG. 13 is a schematic diagram (2) for explaining setting of a scanning position by a scanning-parameter limit calculating unit.

Furthermore, in this case, when creating scanning conditions for a predation scan, the scanning-parameter limit calculating unit 17b sets a scanning position for the preparation scan from a scanning position set for the main scan. Setting of a scanning position by the scanning-parameter limit calculating unit 17b is specifically explained below. FIGS. 12 and 13 are schematic diagrams for explaining setting of a scanning position by the scanning-parameter limit calculating unit 17b. The following description is explained in a case where the center of a scan region and a normal vector that has its origin at the center of the magnetic field, and perpendicularly crosses a slice surface expressing the scan region are used as information indicating a scanning position.

For example, as shown in FIG. 12, it is assumed that a scan region of 40 mm in slice thickness is set in the vicinity of a left chest of the subject, as a scan region R1 for a main scan. It is also assumed that the position of the scan region R1 is denoted by a center C of the scan region and a normal vector V, which has its origin at a magnetic-field center MC and perpendicularly crosses a slice surface that is to be the scan region R1.

In such case, when setting a scan region R2 for a preparation scan, to begin with, the scanning-parameter limit calculating unit 17b calculates the inclination of the scan region R2 with respect to the apparatus coordinates based on the coordinates of the magnetic-field center MC, and the normal vector V indicating the scanning position for the main scan. Moreover, the scanning-parameter limit calculating unit 17b sets the coordinates of the center of the scan region R2 to the same coordinates as those of the center C of the scan region R1. Subsequently, the scanning-parameter limit calculating unit 17b determines the slice thickness of the scan region by referring to the parameter list 14b. For example, if the parameter list 14b shown in FIG. 11 is used, the slice thickness is a fixed parameter, and its fixed valued is 10 mm; therefore the scanning-parameter limit calculating unit 17b sets the slice thickness of the scan region to 10 mm as shown in FIG. 13. Accordingly, the position of the scan region R2 for the preparation scan is automatically set.

In this way, as the parameter list 14b defines a method of setting a scanning position for the preparation scan from the scanning position set for the main scan, and then the scanning-parameter limit calculating unit 17b sets a scanning position for the preparation scan from the scanning position set for the main scan, the scanning position for the preparation scan can be automatically set. Accordingly, operationality of the magnetic resonance imaging apparatus 100 can be further improved.

The components of each device shown in the drawings in the embodiment are conceptual for describing functions, and not necessarily to be physically configured as shown in the drawings. In other words, concrete forms of distribution and integration of the units are not limited to those shown in the drawings, and all or part of the units can be configured to be functionally or physically distributed and integrated in an arbitrary unit depending on various loads and, conditions of the use.

INDUSTRIAL APPLICABILITY

As described above, the magnetic resonance imaging apparatus and the scanning-condition creating method according to the present invention are useful when performing a main scan after optimizing values to be set in some scanning parameters among a plurality of scanning parameters included in scanning conditions by performing a preparation scan, and particularly suitable when it is required to achieve improvement in operationality by automating operations relevant to setting of scanning conditions for a preparation scan.

The invention claimed is:

1. A magnetic resonance imaging (MRI) apparatus comprising:
    a storage unit containing MRI scanning definition information that defines a method for creating scanning conditions for a preparation scan from scanning conditions set for a main scan for each of plural different types of scanning;
    a definition-information acquiring unit that acquires scanning definition information corresponding to a particular one of said different types of a main scan from among scanning definition information stored by the storage unit;
    a preparation-scan condition creating unit that generates data representing scanning conditions for a preparation scan from said scanning definition information for a main scan acquired by the definition-information acquiring unit;
    a preparation-scan control unit that causes execution of a preparation scan based on said scanning conditions for the preparation scan generated by the preparation-scan condition creating unit;
    a main-scan condition setting unit that sets values of at least some scanning parameters for a main scan based on a scan result obtained by executing the preparation scan by the preparation-scan control unit; and
    a main-scan control unit that causes execution of a main scan based on scanning conditions for the main scan that includes the scanning parameters set by the main-scan condition setting unit.

2. The magnetic resonance imaging apparatus according to claim 1, further comprising an operation receiving unit that receives a selection of the type of scanning, wherein the preparation-scan condition creating unit acquires definition information corresponding to the received selection of a type of scanning from definition information stored by the storage unit, and generates scanning conditions for a preparation scan from scanning conditions set for a main scan based on the acquired definition information.

3. The magnetic resonance imaging apparatus according to claim 2, wherein
    the definition information includes information that categorizes a plurality of scanning parameters included in the scanning conditions for a preparation scan, into:
    a first scanning parameter of which value is to be changed during a preparation scan,
    a second scanning parameter having a value which is set to a same value for both a main scan and a preparation scan, and
    a third scanning parameter having values which may be different between a main scan and a preparation scan, and
    defines a method for setting a value for each said scanning parameter, and
    the preparation-scan condition creating unit creates the scanning conditions for a preparation scan by setting a value of each said scanning parameter based on a setting method defined by the definition information.

4. The magnetic resonance imaging apparatus according to claim 3, wherein the scanning parameters categorized by the definition information include a parameter related to establishment of a pulse sequence.

5. The magnetic resonance imaging apparatus according to claim 3, wherein the scanning parameters categorized by the definition information include a parameter related to a setting condition of the apparatus.

6. The magnetic resonance imaging apparatus according to claim 3, wherein
the definition information further defines each of the third scanning parameters as a fixed value predetermined for each scanning parameter as a value to be set for a preparation scan, and
the preparation-scan condition creating unit sets each of the third scanning parameters to a fixed value defined by the definition information.

7. The magnetic resonance imaging apparatus according to claim 3, wherein
the operation receiving unit displays a plurality of images obtained through the preparation scan, and receives a selection of one image from among the displayed images, and
when the operation of selecting an image is received by the operation receiving unit, the preparation-scan condition creating unit sets a first scanning parameter included in the scanning conditions set for the main scan to a value of the first scanning parameter that was used when the selected image was taken.

8. The magnetic resonance imaging apparatus according to claim 2, wherein
the definition information further defines a method of setting a scanning position for a preparation scan from a scanning position set for a main scan, and
the preparation-scan condition creating unit sets a scanning position for a preparation scan from a scanning position set for a main scan.

9. The magnetic resonance imaging apparatus according to claim 1, wherein
the definition information includes information that categorizes a plurality of scanning parameters included in the scanning conditions for a preparation scan, into:
a first scanning parameter having a value which is to be changed during a preparation scan,
a second scanning parameter having a value which is set to a same value for both a main scan and a preparation scan, and
a third scanning parameter having values which may be different between a main scan and a preparation scan, and
defines a method for setting a value for each said scanning parameter, and
the preparation-scan condition creating unit generates scanning conditions for a preparation scan by setting a value for each scanning parameter based on a setting method defined by the definition information.

10. The magnetic resonance imaging apparatus according to claim 9, wherein the scanning parameters categorized by the definition information include a parameter related to establishment of a pulse sequence.

11. The magnetic resonance imaging apparatus according to claim 9, wherein the scanning parameters categorized by the definition information include a parameter related to a setting condition of the apparatus.

12. The magnetic resonance imaging apparatus according to claim 9, wherein
the definition information further defines each of the third scanning parameters as a fixed value predetermined for each scanning parameter as a value to be set for a preparation scan, and
the preparation-scan condition creating unit sets each of the third scanning parameters to a fixed value defined by the definition information.

13. The magnetic resonance imaging apparatus according to claim 9, wherein
the operation receiving unit displays a plurality of images obtained through the preparation scan, and receives a selection of one image from among the displayed images, and
when the operation of selecting an image is received by the operation receiving unit, the preparation-scan condition creating unit sets a first scanning parameter included in the scanning conditions set for the main scan to a value of the first scanning parameter that is used when the selected image was taken.

14. The magnetic resonance imaging apparatus according to claim 9, wherein
the definition information further defines a method of setting a scanning position for a preparation scan from a scanning position set for a main scan, and
the preparation-scan condition creating unit sets a scanning position for a preparation scan from a scanning position set for a main scan.

15. The magnetic resonance imaging apparatus according to claim 1, wherein
the definition information further defines a method of setting a scanning position for a preparation scan from a scanning position set for a main scan, and
the preparation-scan condition creating unit sets a scanning position for a preparation scan from a scanning position set for a main scan.

16. The magnetic resonance imaging apparatus according to claim 1, wherein the preparation-scan condition creating unit automatically creates the scanning conditions for the preparation scan from the scanning conditions set for the main scan.

17. A magnetic resonance imaging (MRI) apparatus comprising:
a storage unit containing information that categorizes a plurality of MRI scanning parameters included in MRI scanning conditions, into a first scanning parameter having a value which is to be changed during a preparation scan, a second scanning parameter having a value that remains the same for a main scan and a preparation scan, and a third scanning parameter having values which may be values different between a main scan and a preparation scan;
an input unit that receives input of values of a plurality for scanning parameters related to scanning conditions for a main scan; and
a control unit that causes execution of a preparation scan and a main scan based on the input values of scanning parameters, and information that categorizes a plurality of scanning parameters stored by the storage unit.

18. The magnetic resonance imaging apparatus according to claim 17, wherein the input unit receives input of information establishing about at least one of a range and an increment for changing a value of the first scanning parameter.

19. The magnetic resonance imaging apparatus according to claim 17, wherein the storage unit stores information establishing at least one of a range and an increment for changing a value of the first scanning parameter.

20. The magnetic resonance imaging apparatus according to claim 17, wherein the storage unit stores a value of the third scanning parameter.

21. A scanning-condition creating method of creating scanning conditions of a magnetic resonance imaging (MRI) apparatus, the method comprising:

storing into a storage unit MRI scanning definition information that defines a method for creating scanning conditions for a preparation scan from scanning conditions set for a main scan for each of plural different types of scanning;

acquiring scanning definition information corresponding to a particular one of said different types of a main scan from among definition information stored by the storage unit;

generating data representing scanning conditions for a preparation scan from said scanning conditions set for the main scan based on said acquired definition information;

causing execution of a preparation scan based on said scanning conditions generated for the preparation scan; and setting values of some scanning parameters included in scanning conditions set for a main scan based on a scan result obtained by executing the preparation scan.

* * * * *